United States Patent
Noguchi

(10) Patent No.: US 7,605,736 B2
(45) Date of Patent: Oct. 20, 2009

(54) A/D CONVERTER AND DUTY CONTROL METHOD OF SAMPLING CLOCK

(75) Inventor: Hidemi Noguchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 604 days.

(21) Appl. No.: 11/214,789

(22) Filed: Aug. 31, 2005

(65) Prior Publication Data
US 2006/0044171 A1 Mar. 2, 2006

(30) Foreign Application Priority Data
Sep. 2, 2004 (JP) .............................. 2004-255115

(51) Int. Cl.
*H03M 1/12* (2006.01)
(52) U.S. Cl. ...................... 341/155; 341/120; 341/164
(58) Field of Classification Search ................ 375/355; 341/126, 155
See application file for complete search history.

(56) References Cited

U.S. PATENT DOCUMENTS

| | | | |
|---|---|---|---|
| 4,253,750 A * | 3/1981 | Maida | 396/287 |
| 4,494,551 A * | 1/1985 | Little et al. | 600/509 |
| 5,712,633 A * | 1/1998 | Bae | 341/120 |
| 5,784,601 A * | 7/1998 | Kisaichi | 713/600 |
| 6,082,196 A * | 7/2000 | Nonoyama et al. | 73/514.18 |
| 6,333,706 B1 * | 12/2001 | Cummings et al. | 341/120 |
| 6,411,245 B2 * | 6/2002 | Oka | 341/155 |
| 6,642,752 B1 * | 11/2003 | Nagaraj | 327/94 |
| 2005/0231253 A1 * | 10/2005 | Smarandache | 327/172 |

FOREIGN PATENT DOCUMENTS

| | | |
|---|---|---|
| JP | 5-244001 | 9/1993 |
| JP | 06178196 A * | 6/1994 |

* cited by examiner

*Primary Examiner*—Shuwang Liu
*Assistant Examiner*—Leon Flores
(74) *Attorney, Agent, or Firm*—McGinn IP Law Group, PLLC

(57) ABSTRACT

An A/D converter comprises a sample and hold circuit receiving a signal and operating based on a sampling clock, an A/D converting circuit converting an output signal of the sample and hold circuit to a digital signal, an A/D output determination circuit outputting a duty control signal based on the digital signal and a sampling clock generator adjusting a duty ratio of a sampling clock and applying the sampling clock to the sample and hold circuit.

21 Claims, 4 Drawing Sheets

A/D CONVERTER AND DUTY CONTROL METHOD OF SAMPLING CLOCK

BACKGROUND OF THE INVENTION

1. Field of the Invention

This invention relates to an A/D converter, and more particularly, to an A/D converter which operates in high speed by adjusting a duty ratio of a sampling clock and a duty control method of a sampling clock.

2. Description of the Related Art

An A/D converter converts an analog signal to a digital signal. In the A/D converter, an analog input signal is sampled and held in a sample and hold circuit. The analog input signal, which is output from the sample and hold circuit, is converted to a digital signal by an A/D converting circuit. In the A/D converter, a sampling clock is applied to the sample and hold circuit. For example, a sampling period corresponds to "H" level of the sampling clock, and a holding period corresponds to "L" level of the sampling clock. The sample and hold circuit samples the analog input signal during the sampling period, and a sampling capacitor in the sample and hold circuit is charged according to the analog input signal. On the other hand, the sample and hold circuit holds and outputs the sampled analog input signal during the holding period.

When the holding period is changed to the sampling period, there is a time period to charge the sampling capacitor to a voltage which is equal to the analog input signal.

When the sampling period is changed to the holding period, there is a time period to settle an output voltage because of a transient response.

The time period to charge the sampling capacitor to the voltage which is equal to the analog input signal is called an acquisition time. The time period to settle the output voltage is called a settling time.

A duty ratio of the sampling clock is 50% in a conventional A/D converter. That is, the sampling period and the holding period have the same length of time in a conventional A/D converter. Therefore, the minimum period of the sampling clock is determined based on a longer period of the sampling period or the holding period. The minimum period Tmin of the sampling clock is twice longer than the longer period of the sampling period or the holding period.

The acquisition time and the settling time are generally different. Therefore, when the acquisition time is 2.5 nsec and the settling time is 5 nsec, the minimum period of the sampling clock becomes 2*5=10 nsec. This period of the sampling clock corresponds to 100 Mega-Samples/sec (hereinafter, MS/sec). Thereby, it is difficult to achieve a high speed operation of the A/D converter.

On the other hand, Japanese Unexamined Patent Application Publication No. 5-244001 discloses a sampling clock which has a duty ratio different from 50%. In Japanese Unexamined Patent Application Publication No. 5-244001, the duty ratio of the sampling clock is uniformly changed from 50%. Therefore, the duty ratio of the sampling clock can not be adjusted based on environments.

As described above, the duty ratio of the sampling clock is not set based on environments. Therefore, it is difficult for the A/D converter to perform a high speed operation based on environments.

SUMMARY OF THE INVENTION

According to one aspect of the present invention, an A/D converter comprises a sample and hold circuit receiving a signal and operating based on a sampling clock, an A/D converting circuit converting an output signal of the sample and hold circuit to a digital signal, an A/D output determination circuit outputting a duty control signal based on the digital signal and a sampling clock generator adjusting a duty ratio of a sampling clock and applying the sampling clock to the sample and hold circuit.

According to one aspect of the present invention a duty ratio control method of an A/D converter, which samples and holds a signal and operates based on a sampling clock having the duty ratio, comprises generating a predetermined training signal, outputting a digital signal which is a digitalized signal of the training signal, measuring a predetermined parameter of the digital signal, comparing the predetermined parameter to an expected value obtained from the training signal and determining the duty ratio of the sampling clock based on a comparison result.

According to one aspect of the present invention a duty ratio control method of an A/D converter, which samples and holds a received signal and operates based on a sampling clock having the duty ratio, comprises outputting a digital signal which is a digitalized signal of the received signal, correcting an error included in the digital signal and determining the duty ratio of the sampling clock based on an error rate included in the digital signal.

BRIEF DESCRIPTION OF THE DRAWINGS

The above and other objects, advantages and features of the present invention will be more apparent from the following description taken in conjunction with the accompanying drawings, in which.

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
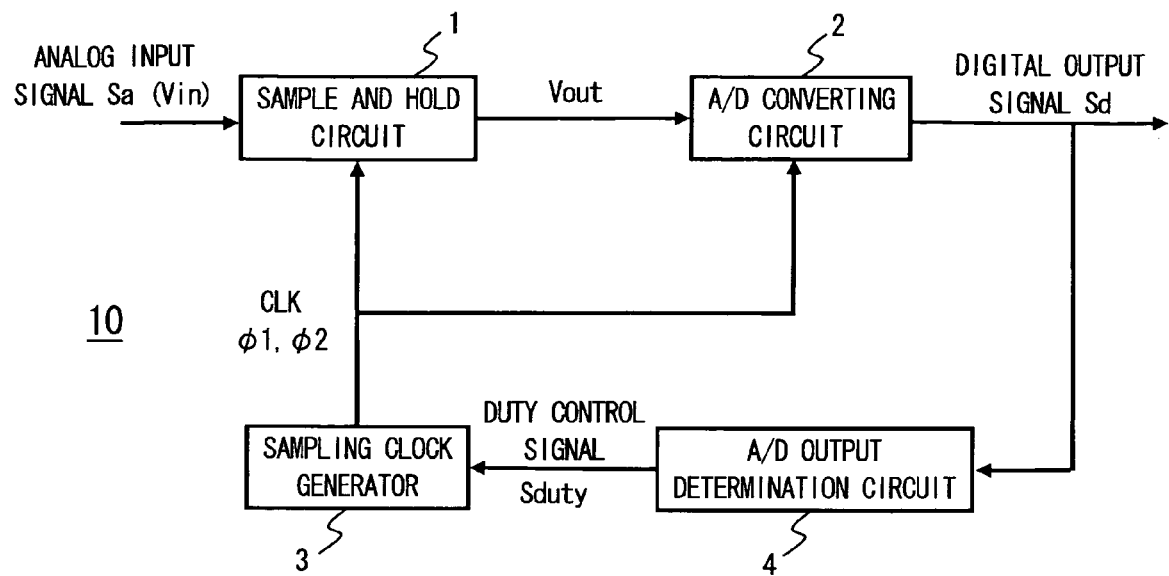
FIG. 1 shows a block diagram of an A/D converter.

FIG. 1 shows a block diagram of an A/D converter 10 of embodiments of the present invention. As shown in FIG. 1, the A/D converter 10 of the embodiments has a sample and hold circuit 1, an A/D converting circuit 2, a sampling clock generator 3 and an A/D output determination circuit 4.

An analog signal Sa which is converted to digital signal Sd is input to the sample and hold circuit 1. The sample and hold circuit 1 samples the input analog signal Sa based on a sampling clock CLK, and holds a voltage Vout which corresponds to the analog signal Sa. The sample and hold circuit 1 outputs the held voltage Vout to the A/D converting circuit 2. Details of the sampling clock CLK are described later.

The A/D converting circuit 2 converts the voltage Vout, which is output from sample and hold circuit 1, to the digital signal Sd. The A/D converting circuit 2 outputs the digital signal Sd.

The sampling clock generator 3 generates the sampling clock CLK. The frequency of the sampling clock CLK corresponds to the sampling frequency. A duty ratio of the sampling clock CLK is determined based on a duty control signal Sduty which is output by the A/D output determination circuit 4. The sampling clock CLK generated in the sampling clock generator 3 is applied to the sample and hold circuit 1 and the A/D converting circuit 2. In the embodiments, two kinds of sampling clocks CLK are generated in detail. One clock is a clock CLKφ1 which becomes "H" level during a sampling period and becomes "L" level during a holding period. Another clock is a clock CLKφ2 which becomes "L" level during the sampling period and becomes "H" level during the holding period. Both clocks are applied to the sample and hold circuit 1 and the A/D converting circuit 2.

The A/D output determination circuit 4 generates the duty control signal Sduty based on data of the digital signal Sd which is the output signal of the A/D converting circuit 20. Various data of the digital signal Sd can be used to generate the duty control signal Sduty. The A/D output determination circuit 4 outputs the duty control signal Sduty, which controls the duty ratio of the sampling clock CLK, to the sampling clock generator 3. A generating operation of the duty control signal Sduty is described later.

In the A/D converter 10 as described above, the sample and hold circuit 1 samples the analog input signal Sa (analog input voltage Vin) according to the sampling clock, and holds analog input voltage Vin as the output voltage Vout. The A/D converting circuit outputs the digital signal Sd corresponding to the output voltage Vout. The A/D converter 10 is described below in detail.

Figure 2:
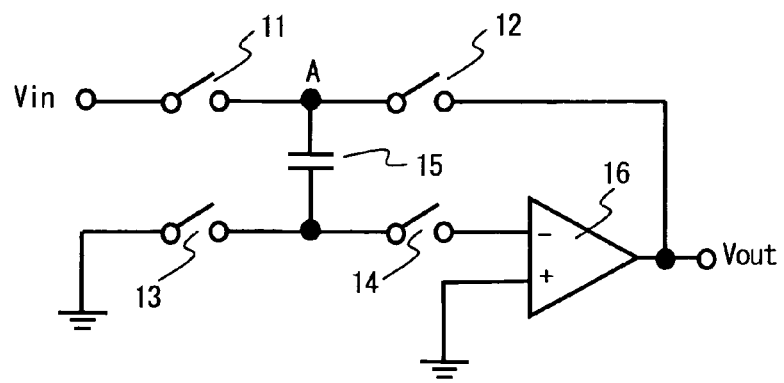
FIG. 2 shows a circuit diagram of the sample and hold circuit.

FIG. 2 shows a circuit diagram of the sample and hold circuit 1 of the embodiments. As shown in FIG. 2, the sample and hold circuit 1 has switches 11 to 14, a sampling capacitor 15 and an operational amplifier 16.

An input voltage Vin, which corresponds to the analog signal Sa, is applied to a first terminal of the sampling capacitor 15 via the switch 11. The first terminal of the sampling capacitor 15 is connected to an output terminal of the sample and hold circuit 1 via the switch 12. A second terminal of the sampling capacitor 15 is connected to the ground via the switch 13. The second terminal of the sampling capacitor 15 is connected to an inverting input terminal of the operational amplifier 16. A non-inverting input terminal of the operational amplifier 16 is grounded. An output terminal of the operational amplifier 16 is the output terminal of the sample and hold circuit 1. The switches 11 and 13 operate based on a same signal, and on/off operations of the switches 11 and 13 are the same. The switches 12 and 14 operate based on a same signal, and on/off operations of the switches 12 and 14 are the same.

Figure 3:
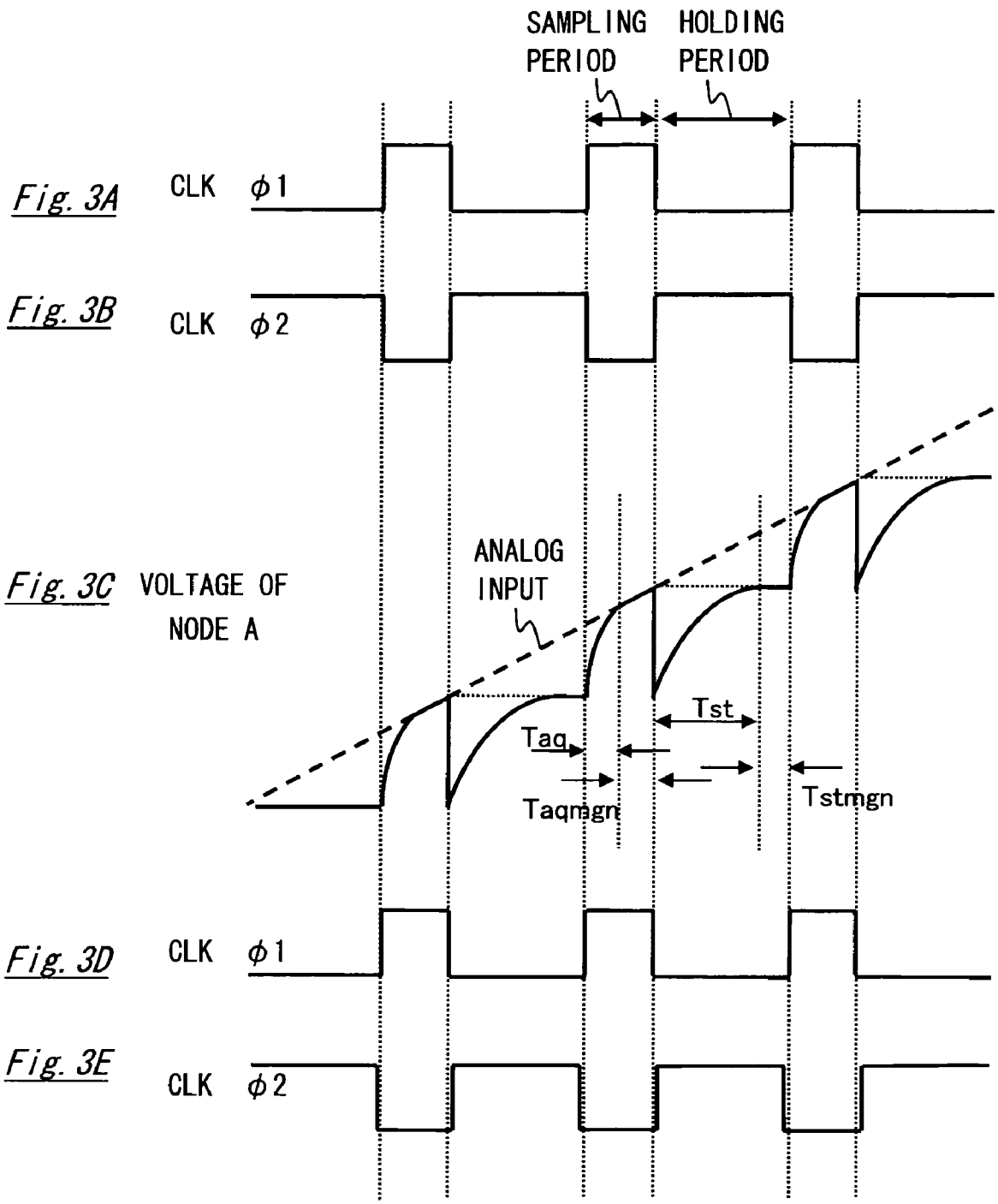
FIG. 3A and FIG. 3B show waveforms of the sampling clocks CLKϕ1 and CLKϕ2 respectively.
FIG. 3C shows the analog input signal S and a voltage of the first terminal of the sampling capacitor.
FIG. 3D and FIG. 3E show other waveforms of the sampling clocks CLKϕ1 and CLKϕ2 respectively.

An operation of the sample and hold circuit 1 is described below. The sample and hold circuit 1 operates based on the sampling clocks CLKφ1 and CLKφ2 that are generated by the sampling clock generator 3. FIG. 3A and FIG. 3B shows waveforms of the sampling clocks CLKφ1 and CLKφ2 respectively. FIG. 3C shows the analog input signal Sa(Vin) and a voltage of the first terminal of the sampling capacitor 15 (a voltage of a node A in FIG. 2). In FIG. 3C, a dashed line shows the analog input voltage Vin and a continuous line shows the voltage of the node A.

While CLKφ1 in FIG. 3A is "H" level and CLKφ2 in FIG. 3B is "L" level, the switches 11 and 13 in the sample and hold circuit 1 are on-state and the switches 12 and 14 become off-state. Thereby, the sampling capacitor 15 is connected between the ground and the analog input voltage Vin. The sampling capacitor 15 is charged based on the analog input voltage Vin (see FIGS. 3A and 3C). Then, CLKφ1 in FIG. 3A becomes "L" level and CLKφ2 in FIG. 3B becomes "H" level. Therefore, the switches 11 and 13 become off-state and the switches 12 and 14 become on-state. After the sampling capacitor 15 is disconnected to the analog input voltage, the sampling capacitor 15 is connected between the inverting input terminal and the output terminal of the operational amplifier 16. While the CLKφ2 is "H" level, the sample and hold circuit 1 holds a voltage value corresponding to the input analog voltage Vin. The held voltage value is output as the output voltage Vout of the sample and hold circuit 1 (see FIGS. 3B and 3C).

In the embodiments, the sampling period corresponds to the period when the CLKφ1 is "H" level, and the holding period corresponds to the period when the CLKφ1 is "L" level. That is, in the embodiments, the sampling period and the holding period change based on the duty ratio of the sampling clock CLKφ1 (φ2). As shown in FIGS. 3D and 3E, there is a case that the both sampling clocks CLKφ1 and CLKφ2 are "L" level when the sampling period changes to the holding period and the holding period changes to the sampling period. The time when both sampling clocks become "L" level is set to achieve a stabilized operation of the sample and hold circuit 1.

As shown in FIG. 3C, immediately after the holding period is changed to the sampling period, the voltage held by the sampling capacitor 15 (the voltage of node A) is different from the analog input signal Sa (analog input voltage Vin). Therefore, it needs time for the voltage of the node A to be equal to the analog input voltage Vin. This time period is called an acquisition time Taq.

After the sampling period is changed to the holding period, it also needs time to settle the output voltage Vout (the voltage of the node A) at the charged voltage because of a transient response caused by switching. This time period is called a settling time Tst.

The acquisition time Taq is generally determined by a time constant τ which is calculated from the capacitance Cs of the sampling capacitor 15 and on-resistance R of the switches 11, 13. On the other hand, the settling time Tst is determined by various factors such as a band width and a slew rate of the operational amplifier 16, the capacitance Cs, a load capacitance, a parasitic capacitance and so on. Therefore, it is difficult to design the sample and hold circuit to have the same period of the acquisition time Taq and the settling time Tst.

If there is little margin Taqmgn against the acquisition time Taq, the sampling period may be changed to the holding period though the sampling capacitor 15 is not charged enough. That is, the sampling period may be changed to the holding period before the voltage of the node A reaches to the analog input signal Sa. In such case, a held voltage of the next holding period does not correspond to the analog input signal Sa, which should be held by the sample and hold circuit 1, and the digital output signal has an error.

On the other hand, if there is little margin Tstmgn against the settling time Tst, a digitalization of the A/D converting circuit 2 may be performed before the output voltage Vout is settled in the holding period. In such case, the digital output signal Sd has an error because the held voltage by the sample and hold circuit is not settled.

In the embodiments, the duty ratio of the sampling clock CLK is controlled based on the duty control signal Sduty which is output by the A/D output determination circuit 4. The A/D output determination circuit 4 generates the signal to control the duty ratio of the sampling clock CLK based on the digital output signal Sd which is actually output by the A/D converting circuit 2.

A first embodiment of the A/D converter 100, which adjusts the duty ratio of the sampling clock CLK, is described below.

Figure 4:
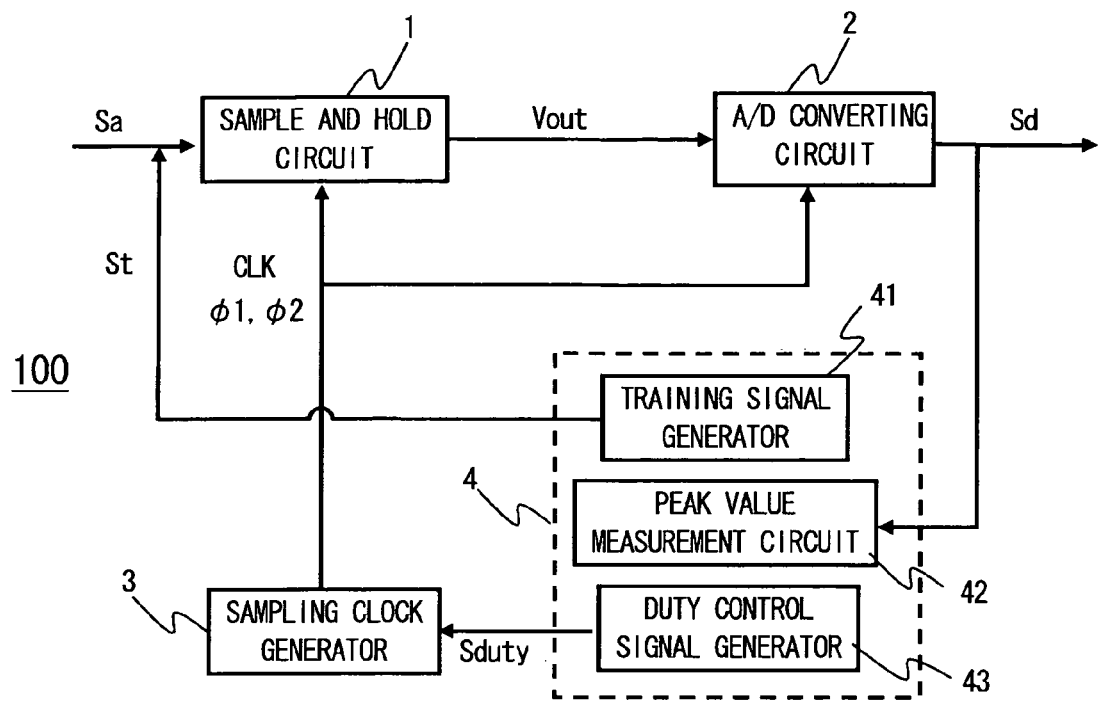
FIG. 4 shows the A/D converter 100 which includes the A/D output determination circuit 4 of the first embodiment.

FIG. 4 shows the A/D converter 100 which includes one example of the A/D output determination circuit 4. The A/D output determination circuit 4 of this embodiment has a training signal generator 41, a peak value measurement circuit 42 and a duty control signal generator 43. As shown in FIG. 4, the training signal generator 41 of the present embodiment is connected to the analog signal input terminal of the sample and hold circuit 1. The digital output signal Sd from the A/D converting circuit 2 is input to the peak value measurement circuit 42 of the A/D output determination circuit 4. The peak value measurement circuit 42 is only an example of an output signal measurement circuit.

In the A/D output determination circuit 4, the training signal generator 41 generates a training signal St which has a predetermined waveform. The training signal St is generated to control the duty ratio of the sampling clock CLK. The waveform of the training signal is previously determined (for example, an amplitude, a frequency and so on). The peak value measurement circuit 42 measures the peak value of the digital output signal Sd, which is a digitalized signal of the training signal St by the A/D converting circuit 2. The duty control signal generator 43 generates the duty control signal Sduty which controls duty ratios of the sampling clocks CLKφ1 and CLKφ2. The duty control signal generator 43 outputs the duty control signal which gradually changes the duty ratio of the sampling clock CLK during a duty adjustment process.

An adjustment operation of the duty ratio of the sampling clock using the A/D output determination circuit 4 shown in FIG. 4 is described below. When the duty ratio of the sampling clock is adjusted using the A/D output determination circuit 4, the duty adjustment process has to be performed. The duty adjustment process can be carried out during a screening test before shipping ICs or a start-up process of the A/D converter 100. Further, the duty adjustment process can be carried out based on duration of a circuit operation. In such case, when the A/D converter 100 operates a predetermined duration, an A/D converting operation is temporarily halted, and the duty adjustment process is carried out.

In this embodiment, the A/D output determination circuit 100, for example, performs the duty adjustment process when the circuit is activated. When a signal to start the duty adjustment process is input to the A/D output determination circuit 4, the training signal generator 41 generates the training signal St. The waveform of the training signal is not limited to a specific waveform as long as the waveform is previously determined. The operation based on a sinusoidal signal is described below as a simple example.

In the duty adjustment process, the sinusoidal signal which is generated by the training signal generator 41 is input to the sample and hold circuit 1. The sample and hold circuit 1 samples and holds the training signal (sinusoidal signal). The default duty ratio of the sampling clock is used in this sampling and holding. The A/D converting circuit 2 digitalizes the output signal (Vout) of the sample and hold circuit 1, and outputs the digital output signal Sd. The data of the digital output signal Sd is input to the peak value measurement circuit 42. The peak value measurement circuit 42 measures the maximum amplitude (peak value) of the sine waveform which are generated based on the digital output signal sd. The peak value measurement circuit 42 stores the measured peak value.

Then, the A/D output determination circuit 4 repeats the peak value measurement of the above description with changing the duty ratio of the sampling clock. The A/D output determination circuit 4 determines an optimum value of the duty ratio of the sampling clock according to the peak values measured from the digital output signal Sd. The determination of the optimum value based on the peak value measurement is described below.

Figure 5:
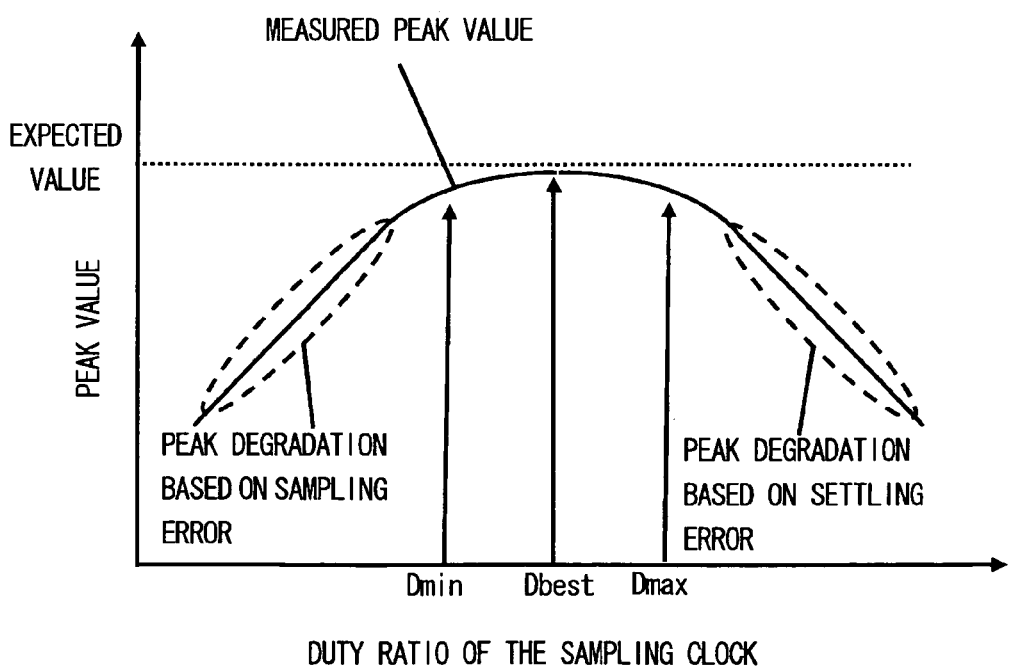
FIG. 5 shows a relationship between the variation of the duty ratio of the sampling clock CLKϕ1 and the measured peak value.

FIG. 5 shows a relationship between the variation of the duty ratio of the sampling clock CLKφ1 and the measured peak value. A dashed line of the FIG. 5 shows an expected value of the peak value of the digital output signal Sd. The expected value can be calculated because the training signal St is the predetermined sinusoidal signal.

As described above, if the margin Taqmgn against the acquisition time Taq is not enough, the error based on the sampling operation becomes large. If the margin Tstmgn against the settling time Tst is not enough, the error based on the settling operation becomes large. Therefore, the error becomes large when the duty ratio of the sampling clock CLKφ1 is too large or too small. The difference between the expected value and the measured peak value based on the digital output signal Sd becomes large when the duty ratio of the sampling clock CLK is out of a proper range of duty ratio (see FIG. 5).

In this embodiment, the peak values of the digital output signal Sd are measured. Each of the peak values corresponds to a different duty ratio which is varied during the duty adjustment process.

Two points are picked up from the measured peak values in the present embodiment. These points correspond to the peak value degrading by 3 db than the expected value, and the closest peak value to the expected value is disposed therebetween.

One point corresponds to a smaller duty ratio Dmin than the duty ratio of the closest peak value to the expected value. Another point corresponds to a larger duty ratio Dmax than the duty ratio of the closest peak value to the expected value. The point corresponding to the duty ratio Dmin represents a lack of the acquisition time Taq, and the error of the sampling period. The point corresponding to the duty ratio Dmax represents a lack of the settling time Tst, and the error of the holding period.

When the measurement of the peak value as above described is performed, the optimized duty ratio Dbest of the sampling clock CLK is determined as Dbest=(Dmin+Dmax)/2. When the duty ratio Dbest is determined, the A/D output determination circuit 4 stores a setting of the duty ratio Dbest in a register (not shown), and the duty adjustment process is ended. The A/D output determination circuit 4 outputs the duty control signal Sduty based on the duty ratio Dbest stored in the register during a normal operation (except for the duty adjustment operation). The sampling clock generator 3 generates the sampling clock CLKφ1, which corresponds to the duty ratio Dbest, based on the duty control signal Sduty. The duty ratio of the sampling clock CLKφ2 is also determined based on the duty control signal Sduty.

As described above, in the A/D converter 100 of the first embodiment, the duty ratio of the sampling clock to sample the analog input signal is adjusted to the optimum value based on the duty control signal Sduty output by the A/D output determination circuit 4. Therefore, the duty ratio of the sampling clock CLK is optimized, and a high speed and a high accuracy operation of the A/D converter can be achieved.

In the A/D converter of high speed and high accuracy such as 10 bits and 100 MS/sec, the acquisition time Taq of the sample and hold circuit is about $7\tau$ ($\tau$: above described time constant). On the other hand, the settling time Tst becomes long because of the difficulty of the speeding up of the operational amplifier. That is, it tends to be Taq<Tst. Assuming that Taq is 2.5 nsec, and Tst is 5 nsec, the optimum (minimum) period Tmin of the sampling clock is 7.5 nsec. According to the present invention, the duty ratio of the sampling clock is optimized; therefore, the maximum frequency fsmax of the sampling clock is improved as described below.

$$fsmax=1/Tmin=1/(Taq+Tst)=133 \text{ MS/sec}$$

As described above, high speed operation can be achieved by optimizing the duty ratio of the sampling clock.

In the above described embodiment, the duty adjustment process can be carried out when the circuit is activated. If the duty adjustment process is carried out each time when the circuit is activated, the duty ratio can be controlled based on environments.

In the above described embodiment, the optimum duty ratio is determined based on the duty ratios which degrade by 3 db from the expected value. However, the optimum duty ratio can be determined by selecting the peak value which is closest to the expected value, when the duty ratio is varied.

Further, in the above described embodiment, the optimum duty ratio is determined based on a peak value of the amplitude. However, the optimum duty ratio can be determined in various ways. For example, an electric power also can be used to determine the optimum duty ratio. That is, various kinds of parameter, which can be obtained from the training signal St and measured from the digital output signal Sd, may be used. Therefore, various kinds of output signal measurement circuit can be used instead of the peak value measurement circuit 42.

That is, in this embodiment, the expected value, which can be obtained from the training signal such as a peak value and an electric power, is previously stored in a memory (for example, register) of the A/D output determination circuit 4. In the duty adjustment process, the parameter which is measured from the digital output signal is compared to the stored expected value. In the duty adjustment process, the digital output signal is a digitalized signal of the training signal and the measured parameter corresponds to the expected value. According to the comparison result, the duty ratio of the sampling clock is controlled and optimized.

In the first embodiment, the A/D output determination circuit 4 is included in the A/D converter 100 in order to catch up with changes of the environments. However, if the A/D converter 100 is used in an environmentally stable situation, the A/D output determination circuit 4 has not to be included in the A/D converter 100. In such case, in order to adjust the manufacturing error, the duty control process can be carried out by a tester when the test is performed in a manufacturing process. If the A/D output determination circuit 4 is not included in the A/D converter 100, the tester generates the training signal, measures the peak value, determines the optimal duty ratio Dbest, and writes a setting of Dbest into the memory of the A/D converter.

Another example of the A/D output determination circuit 4 is described below as a second embodiment. In an information communication system, a multilevel code is often used to transport a digital signal. In the communication system using the multilevel code, the code means not only "L" or "H" but also 4 values or 16 values. An amount of digital Data transported in the communication system can be increased by using the multilevel code. In such communication systems, a receiver system has to regenerate a digital signal transmitted by a transmitter system. In order to regenerate the digital signal, an A/D converter is often used. Further, in a radio communication system or a high speed communication system, an A/D converter is often used to regenerate a digital signal. The A/D output determination circuit 4 described below is especially useful for the A/D converter to regenerate a digital signal.

Figure 6:
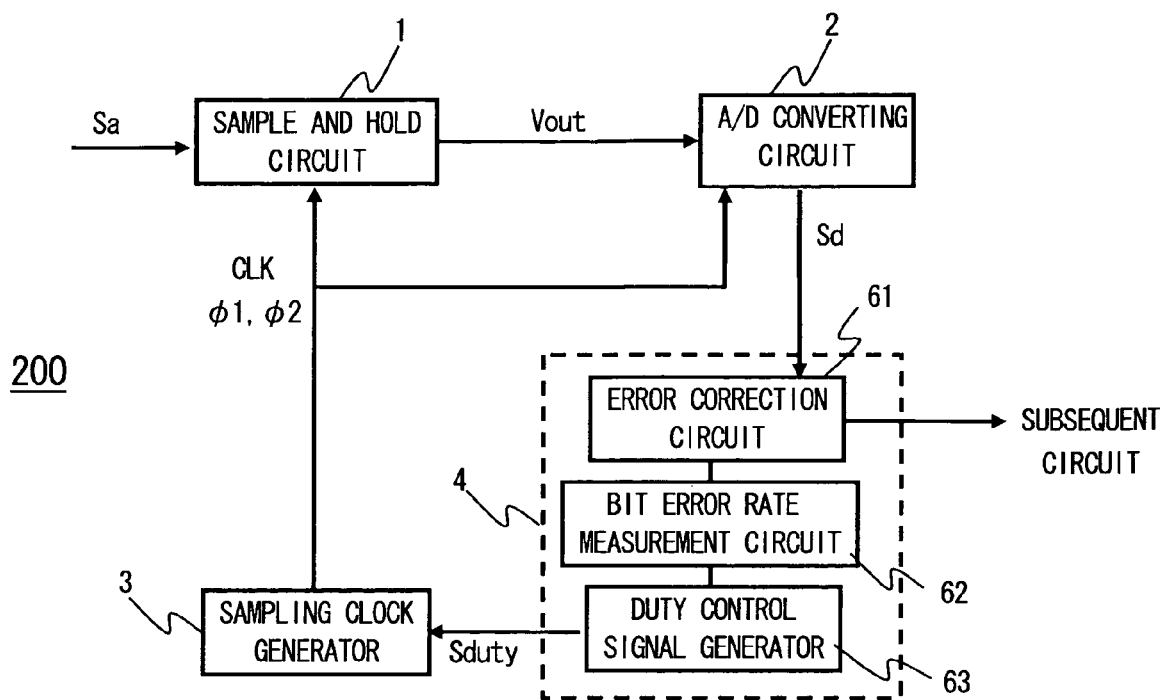
FIG. 6 shows an A/D converter 200 of the second embodiment.

FIG. 6 shows an A/D converter 200 of the second embodiment. Structures are the same as the above described embodiments except for the A/D output determination circuit 4. Therefore, detailed description of each structure is omitted. The difference from the A/D converter 100 shown in FIG. 4 is the output terminal of the A/D converter 200. The output signal of the A/D converter 200 is not the output of the A/D converting circuit 2. Because the A/D converter 200 of the second embodiment is the A/D converter to regenerate a digital input signal, the output signal of the A/D converting circuit 2 is applied to an error correction circuit 61. The output of the error correction circuit 61 is the output signal of the A/D converter 200. A digital data corrected by the error correction circuit 61 is applied to a subsequent circuit.

In the A/D converter 200, the A/D output determination circuit 4 has the error correction circuit 61, a BER (Bit Error Rate) measurement circuit 62 and a duty control signal generator 63.

When the A/D converter 200 is used to regenerate a received digital signal, the received digital signal includes various information which is added by a transmitting system. Therefore, the digital output signal Sd output by the A/D converting circuit 2 also includes various information. The information involves, for example, information for indicating a validity such as a parity bit and CRC (cyclic Redundancy Check), or information for error correction. The information for error collection is data to correct the regenerated digital signal such as FEC (Forward Error Correction) when the regenerated digital signal has errors.

The error correction circuit 61 corrects errors of the digital signal Sd which is regenerated by the A/D converting circuit 2 using above described information added by a transmitter system. In the second embodiment, the BER measurement circuit 62 measures an error rate which is determined as error in the error correction circuit 61. That is, a ratio of the corrected signals, which are determined as errors and corrected by the error correction circuit 61, in the digital output signal Sd of the A/D converting circuit 2 is measured. The duty control signal generator 63 outputs the duty control signal Sduty, which controls the duty ratio of the sampling clock CLK, based on the measurement result of the BER measurement circuit 62.

Figure 7:
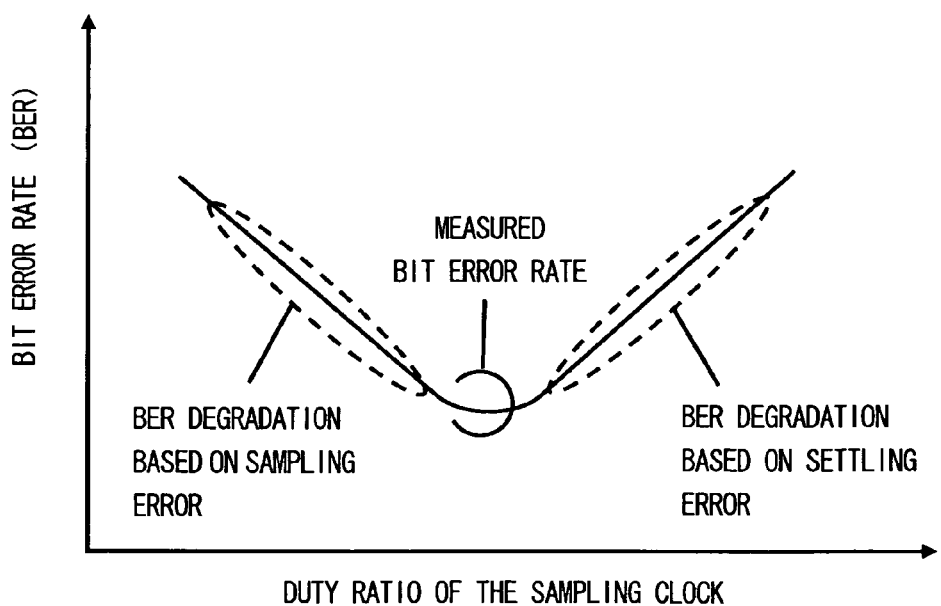
FIG. 7 shows a relationship between the duty ratio of the sampling clock and the BER.

FIG. 7 shows a relationship between the duty ratio of the sampling clock CLKφ1 and the BER. As described above, if the duty ratio of the sampling clock CLKφ1 becomes too small, the margin against the acquisition time becomes small. The error caused by the sampling operation becomes large. Therefore, when the received signal is regenerated by the A/D converting circuit 2, the regenerated digital signal includes a lot of errors, and the BER becomes large.

If the duty ratio of the sampling clock CLKφ1 becomes too large, the margin against the settling time becomes small. The BER becomes large.

In the A/D output determination circuit 4 shown in FIG. 6, the BER measurement circuit 62 continuously monitors the BER. The duty control signal Sduty is generated and output based on the measured BER. Thus, when the A/D converter 200 is used to regenerate a received digital signal, the BER can be continuously minotored. Therefore, the duty control signal can be changed successively. For example, when the BER is over the predetermined value, the duty control signal can be changed to decrease the BER to be below the predetermined value, and the duty ratio of the sampling clock is optimized. In the A/D converter 200 of the second embodiment, by using the BER, the duty ratio of the sampling clock CLK is controlled in real time while the communication is carried out (background control is achieved), therefore, the optimized duty ratio can be continuously obtained.

As described above, the A/D converter according to the embodiments of the present invention optimize the duty ratio of the sampling clock. Therefore, the A/D converter is able to achieve a high speed and high accuracy operation. An optimization of the duty ratio of the sampling clock is achieved by controlling the duty ratio of the sampling clock as described in the operation. The measurements of the peak value of the training signal and the BER are only described in the embodiments as the A/D output determination circuit 4; however, other measurements of the digital output signal can be applied to the present invention. For example, a SNDR (Signal Noise Distortion Ratio) which is measured from the signal, noise and distortion of the digital output signal can be used to adjust the duty ratio. If the SNDR is used to control the duty ratio, the A/D output determination circuit 4 can be realized by extracting a signal component, a noise component and a component corresponding to distortion from the frequency spectrum of the digital output signal.

It is apparent that the present invention is not limited to the above embodiment, that may be modified and changed without departing from the scope and spirit of the invention.

What is claimed is:

1. An analog to digital (A/D) converter, comprising: a sample and hold circuit receiving a signal and operating based on a sampling clock; an A/D converting circuit converting an output signal of the sample and hold circuit to a digital signal; an A/D output determination circuit outputting a duty control signal based on the digital signal; a training signal generator, provided at an output of the A/D output determination circuit, to generate a predetermined training signal and outputting the training signal to the sample and hold circuit, wherein the A/D output determination circuit compares an expected value obtained from the training signal to a parameter obtained from the digital output signal and generates the duty control signal based on a comparison result; and a sampling clock generator adjusting a duty ratio of a sampling clock based on the comparison result and applying the sampling clock to the sample and hold circuit.

2. The A/D converter as claimed in claim 1, wherein the A/D output determination circuit comprises: an output signal measurement circuit receiving the digital signal, which is a digitalized signal of the training signal, from the A/D converting circuit and measuring the digital output signal; and a duty control signal generator generating the duty control signal based on a measurement result of the output signal measurement circuit.

3. The A/D converter as claimed in claim 1, wherein the parameter corresponds to the expected value.

4. The A/D converter as claimed in claim 1, wherein the expected value is stored in the A/D output determination circuit.

5. The A/D converter as claimed in claim 1, wherein the A/D converter regenerates a digital signal from the received signal, and
wherein the A/D output determination circuit comprises:
an error correction circuit correcting an error included in the digital signal; an error rate measurement circuit measuring an error rate of the digital signal which is determined as the error in the error correction circuit; and
a duty control signal generator generating the duty control signal based on a measurement result of the error rate measurement circuit.

6. The A/D converter as claimed in claim 1, wherein the A/D output determination circuit generates the duty control signal to decrease the error rate measured by the error rate measurement circuit.

7. The A/D converter as claimed in claim 1, further comprising a duty control signal generator that outputs the duty control signal to gradually change the duty ratio of the sampling clock during a duty adjust process.

8. The A/D converter as claimed in claim 7, further comprising:
a training signal generator configured to output a training signal; and
a peak value measurement circuit to measure the maximum amplitude of the training signal.

9. The A/D converter as claimed in claim 8, wherein the A/D output determination circuit changes the duty ratio of the sampling clock and repeats the peak value measurement to determine an optimum value of the duty ratio of the sampling clock based on the peak values measured from the digital signal.

10. The A/D converter as claimed in claim 8, wherein a difference between an expected value and the measured peak value is determined, and
wherein two points are picked up from the measured peak values, the first point corresponding to a smaller duty ratio and the second point correcting to a larger duty ratio.

11. The A/D converter as claimed in claim 10, wherein the smaller duty ratio corresponds to a lack of acquisition time.

12. The A/D converter as claimed in claim 10, wherein the larger duty ratio corresponds to a lack of settling time.

13. The A/D converter as claimed in claim 10, wherein the A/D output determination stores an optimized duty ratio is determined as an average of the smaller duty ratio and the larger duty ratio, and
wherein sampling clock generator generates a sampling clock based on the optimized duty ratio.

14. The A/D converter as claimed in claim 1, wherein the A/D output determination circuit determines a smaller duty ratio corresponding to a lack of acquisition time and a larger duty ratio corresponding to a lack of settling time.

15. The A/D converter as claimed in claim 14, wherein the A/D output determination circuit determines the duty ratio of the sampling clock as an average of the smaller duty ratio and the larger duty ratio.

16. A duty ratio control method of an analog to digital (A/D) converter which samples and holds a signal and operated based on a sampling clock having a duty ratio, the method comprising: generated a predetermined training signal at an output of the A/D converter; outputting a digital signal which is a digitalized signal of the training signal; measuring a predetermined parameter of the digital signal; comparing the predetermined parameter to an expected value obtained from the training signal; and determining the duty ratio of the sampling clock based on a comparison result.

17. The method as claimed in claim 8, wherein the determining the duty ratio of the sampling clock comprises:
   determining a smaller duty ratio corresponding to a lack of acquisition time; and
   determining a larger duty ratio corresponding to a lack of settling time.

18. The method as claimed in claim 17, wherein the determining the duty ratio of the sampling clock further comprises determining an optimized duty ratio as an average of the smaller duty ratio and the larger duty ratio.

19. A duty ratio control method of an analog to digital (A/D) converter which samples and holds a received signal, operates based on a sampling clock having a duty ratio and regenerated a digital signal from the received signal, the method comprising: outputting a digital signal which is a digitalized signal of the received signal; correcting an error included in the digital signal; generating a predetermined training signal at an output of the A/D converter; comparing an expected value obtained from the training signal to a parameter obtained from the digital signal and generating a duty control signal based on the comparison result; and determining the duty of the sampling clock based on an error rate including the digital signal and the comparison result.

20. The method as claimed is claim 19, wherein the determining the duty ratio of the sampling clock comprises: measuring a ratio of corrected signals; and decreasing the duty ratio when the measured ratio of corrected signals becomes too large.

21. The method as claimed in claim 19, wherein the determining the duty ratio of the sampling clock comprises:
   measuring a ratio of corrected signals;
   increasing the duty ratio when the measured ratio of corrected signals becomes too small.

* * * * *